(12) United States Patent
See et al.

(10) Patent No.: US 11,720,318 B2
(45) Date of Patent: Aug. 8, 2023

(54) AUDIO ACCESSORY WITH HIGH AND LOW IMPEDANCE PATHS TO A SPEAKER, AND A RADIO FOR THE AUDIO ACCESSORY

(71) Applicant: MOTOROLA SOLUTIONS, INC., Chicago, IL (US)

(72) Inventors: Joo Yih See, Penang (MY); Daniel Grobe Sachs, Chicago, IL (US); Heng Leong Leong, Penang (MY); Robert A. Zurek, Chicago, IL (US); Sheau Wei Ch'Ng, Penang (MY)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 76 days.

(21) Appl. No.: 17/554,441

(22) Filed: Dec. 17, 2021

(65) Prior Publication Data

US 2023/0195408 A1  Jun. 22, 2023

(51) Int. Cl.
G06F 3/16 (2006.01)
G08C 17/02 (2006.01)
H03F 3/183 (2006.01)
H04R 3/00 (2006.01)

(52) U.S. Cl.
CPC ............ *G06F 3/162* (2013.01); *G08C 17/02* (2013.01); *H03F 3/183* (2013.01); *H04R 3/00* (2013.01); *H03F 2200/03* (2013.01); *H04R 2420/03* (2013.01)

(58) Field of Classification Search
CPC ....................................................... G06F 3/16
See application file for complete search history.

(56) References Cited

U.S. PATENT DOCUMENTS

| | | | | |
|---|---|---|---|---|
| 3,705,412 A * | 12/1972 | Nakamura | ............ | H04M 9/001 379/176 |
| 5,153,914 A * | 10/1992 | Iwano | ...................... | H04R 3/12 381/116 |
| 6,594,366 B1 * | 7/2003 | Adams | ................. | H04B 1/3805 381/74 |
| 9,794,669 B2 | 10/2017 | Wen et al. | | |
| 10,149,042 B2 | 12/2018 | Mackay et al. | | |
| 10,341,839 B2 | 7/2019 | Mfaro et al. | | |
| 10,554,237 B1 * | 2/2020 | Lim | ..................... | H04B 1/3827 |
| 10,659,037 B2 | 5/2020 | Corvino et al. | | |
| 10,797,504 B2 * | 10/2020 | Lim | ..................... | H02J 50/402 |
| 11,038,383 B2 * | 6/2021 | Jakl | ..................... | H04B 5/0031 |

(Continued)

*Primary Examiner* — Olisa Anwah
(74) *Attorney, Agent, or Firm* — Perry + Currier, Inc.

(57) ABSTRACT

An audio accessory with high and low impedance paths to a speaker is provided, and a radio therefor. The audio accessory comprises: a speaker; an audio interface to connect to a respective audio interface of the radio; a switching circuit comprising: high and low impedance paths; and a switch to connect the audio interface to the speaker via one of the high and low impedance paths, the switch initially connecting the audio interface to the speaker via the high impedance path. The accessory further comprises a data interface to connect to a respective data interface of the radio; and a controller to: in response to receiving, via the first data interface, from the radio, a message to control the switch to connect the audio interface to the speaker via the low impedance path, control the switch to connect the audio interface to the speaker via the low impedance path.

20 Claims, 5 Drawing Sheets

(56) References Cited

U.S. PATENT DOCUMENTS

| | | | |
|---|---|---|---|
| 11,044,115 B1* | 6/2021 | Lee | H02H 3/10 |
| 2005/0064822 A1 | 3/2005 | Higgins et al. | |
| 2007/0124526 A1* | 5/2007 | Sinai | G06F 13/4022 |
| | | | 710/306 |
| 2008/0009253 A1* | 1/2008 | Callias | H04R 25/558 |
| | | | 381/328 |
| 2008/0013759 A1* | 1/2008 | Baird | H04R 5/04 |
| | | | 381/94.6 |
| 2011/0033060 A1* | 2/2011 | Johnson | H04M 1/6008 |
| | | | 381/71.6 |
| 2011/0128075 A1* | 6/2011 | Maier | H03F 3/217 |
| | | | 330/144 |
| 2015/0105117 A1* | 4/2015 | Larson | H04M 1/6066 |
| | | | 455/518 |

* cited by examiner

AUDIO ACCESSORY WITH HIGH AND LOW IMPEDANCE PATHS TO A SPEAKER, AND A RADIO FOR THE AUDIO ACCESSORY

BACKGROUND OF THE INVENTION

Audio accessories, such as radio speaker microphones, may be connected to radios such that sound generated by the radios is emitted from the audio accessories. Older audio accessories and radios may have particular capabilities, whereas newer audio accessories and radios may have certain improved and/or different capabilities. As such, newer audio accessories may not be backwards compatible with older radios, and, similarly, newer radios may not be backwards compatible with older audio accessories.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
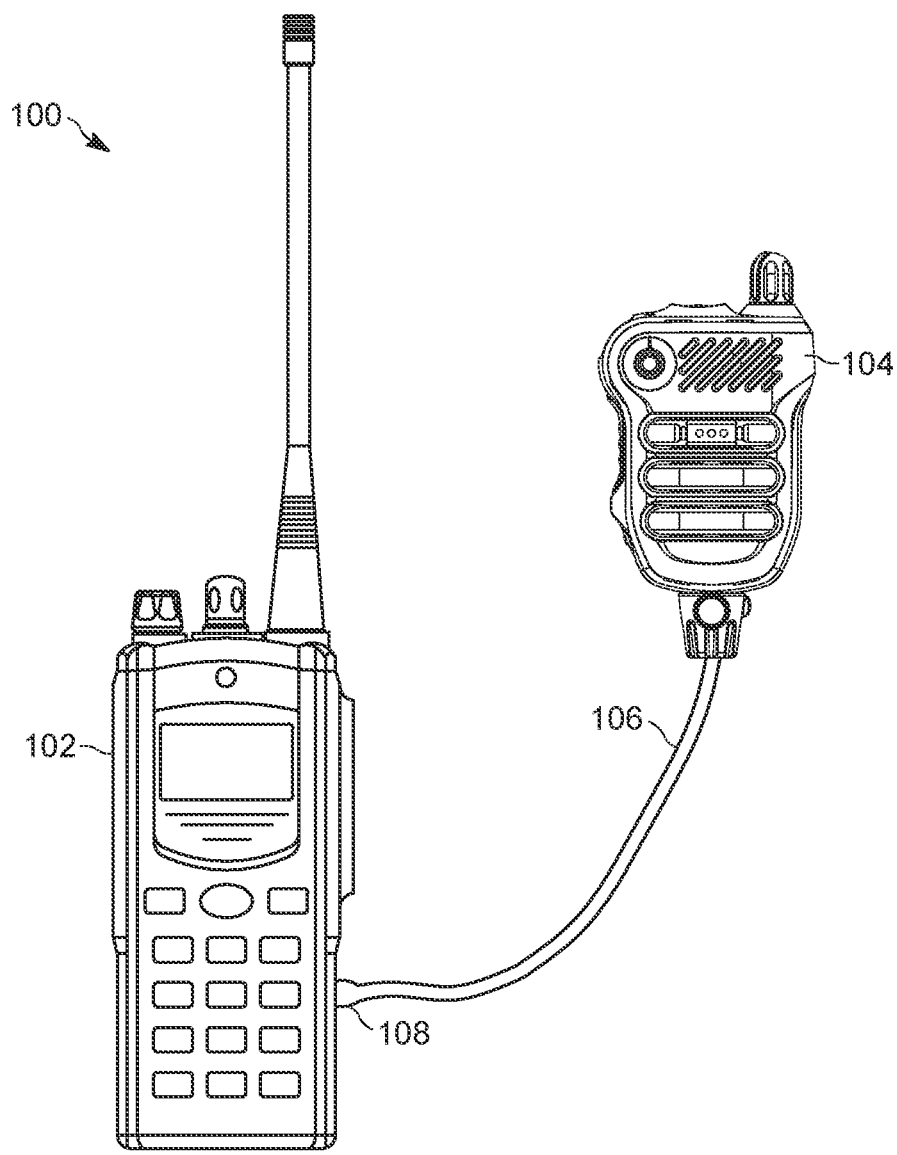
FIG. 1 is a system that includes a radio and an audio accessory with a high impedance path and a low impedance path between an audio interface and a speaker, and a switch to switch between the impedance paths, in accordance with some examples.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

Audio accessories, such as radio speaker microphones, may be connected to radios such that sound generated by the radios is emitted from the audio accessories. Older audio accessories and radios may have particular capabilities, whereas newer audio accessories and radios may have certain improved and/or different capabilities. As such, newer audio accessories may not be backwards compatible with older radios, and, similarly, newer radios may not be backwards compatible with older audio accessories. For example, newer radios may be capable of outputting sound to newer audio accessories that have low impedance speaker lines, leading to louder sound being emitted at similar output powers than when older audio accessories with higher impedance speaker lines are used with the newer radios. However, such newer radios should also work with older audio accessories having higher impedance speaker lines. Similarly, newer audio accessories with lower impedance speaker lines should work with older radios not capable of outputting sound to according to low impedance speaker lines. Thus, there exists a need for an improved audio accessory with high and low impedance paths to a speaker, a radio to control switching at the audio accessory between the high and low impedance paths, and methods therefor.

In particular, an audio accessory is provided herein that includes a high impedance path and a low impedance path between an audio interface and a speaker, and a switch to connect the audio interface to the speaker via one of the high impedance path or the low impedance path. The high and low impedance paths may generally include respective pairs of speaker lines. The audio interface is generally connectable to a respective audio interface at a radio, which provides audio signals to the audio accessory to produce sound at the speaker. In general, the low impedance path may result in better and/or louder sound from the speaker, as compared to the high impedance path, for a same and/or similar amount of power of the audio signals. However, if a radio, and/or an amplifier thereof, is not configured to operate according to an impedance of the low impedance path, the radio and/or the amplifier, may be damaged by way of the low impedance path drawing more current than the radio and/or amplifier can provide.

As such the switch initially connects the audio interface to the speaker via the high impedance path in the event that a radio connected to the audio accessory is a radio not configured to operate according to an impedance of the low impedance path.

However, assuming the radio is configured to operate according to an impedance of the low impedance path, the radio may transmit, to the audio accessory, via respective first data interfaces, a message to control the switch to connect the audio interface to the speaker via the low impedance path. The audio accessory, in response to receiving the message, controls the switch to connect the audio interface to the speaker via the low impedance path. The audio accessory may transmit, to the radio, via a respective message that the audio interface is connected to the speaker via the low impedance path. In response to receiving the respective message, the radio may tune one or more of a digital signal processor, generating an audio signal, and the amplifier, amplifying the audio signal, according to given low impedance parameters.

An aspect of the specification provides an audio accessory for a radio, the audio accessory comprising: a speaker; an audio interface to connect to a respective audio interface of the radio; a switching circuit located between the audio interface and the speaker, the switching circuit comprising: a high impedance path between the audio interface and the speaker; a low impedance path between the audio interface and the speaker; and a switch to connect the audio interface to the speaker via one of the high impedance path or the low impedance path, the switch initially connecting the audio interface to the speaker via the high impedance path; a first data interface to connect to a respective first data interface of the radio; and a controller configured to: receive, via the first data interface, from the radio, a message to control the switch to connect the audio interface to the speaker via the low impedance path; and in response to receiving the message, control the switch to connect the audio interface to the speaker via the low impedance path.

Another aspect of the specification provides a method comprising: receiving, at an audio accessory, from a radio, via respective first data interfaces, a message to control a switch at the audio accessory to connect an audio interface of the audio accessory to a speaker of the audio accessory via a low impedance path, the switch initially connecting the audio interface to the speaker via a high impedance path; and in response to receiving the message, controlling, at the audio accessory, the switch to connect the audio interface to the speaker via the low impedance path.

Another aspect of the specification provides a radio to connect to an audio accessory, the radio comprising: an audio interface to connect to a respective audio interface of the audio accessory; a digital signal processor (DSP) to generate sound signals; an amplifier to output the sound signals to the audio interface; a first data interface to connect to a respective first data interface of the audio accessory; and a controller configured to: transmit, via the first data interface, to the audio accessory, a message to control a switch at the audio accessory to connect the respective audio interface to a speaker of the audio accessory via a low impedance path; receive, via the first data interface, from the audio accessory, a respective message indicating that the respective audio interface of the audio accessory is connected to the speaker via the low impedance path; and in response to receiving the respective message, tune one or more of the DSP and the amplifier according to given low impedance parameters.

Another aspect of the specification provides a method comprising: transmitting, from a radio, to an audio accessory, via respective first data interfaces, a message to control a switch at the audio accessory to connect an audio interface of the audio accessory to a speaker of the audio accessory via a low impedance path; receiving, at the radio device, from the audio accessory, via the respective first data interfaces, a respective message indicating that the respective audio interface of the audio accessory is connected to the speaker via the low impedance path; and in response to receiving, at the radio, from the audio accessory, via the via respective first data interfaces, the respective message, tune one or more of a DSP of the radio and an amplifier of the radio according to given low impedance parameters.

Each of the above-mentioned aspects will be discussed in more detail below, starting with example system and device architectures of the system, in which the embodiments may be practiced, followed by an illustration of processing blocks for achieving an improved audio accessory with high and low impedance paths to a speaker, and a radio to control switching between the high and low impedance paths.

Example embodiments are herein described with reference to flowchart illustrations and/or block diagrams of methods, apparatus (systems) and computer program products according to example embodiments. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a special purpose and unique machine, such that the instructions, which execute via the processor of the computer or other programmable data processing apparatus, create means for implementing the functions/acts specified in the flowchart and/or block diagram block or blocks. The methods and processes set forth herein need not, in some embodiments, be performed in the exact sequence as shown and likewise various blocks may be performed in parallel rather than in sequence. Accordingly, the elements of methods and processes are referred to herein as "blocks" rather than "steps."

These computer program instructions may also be stored in a computer-readable memory that can direct a computer or other programmable data processing apparatus to function in a particular manner, such that the instructions stored in the computer-readable memory produce an article of manufacture including instructions, which implement the function/act specified in the flowchart and/or block diagram block or blocks.

The computer program instructions may also be loaded onto a computer or other programmable data processing apparatus that may be on or off-premises, or may be accessed via the cloud in any of a software as a service (SaaS), platform as a service (PaaS), or infrastructure as a service (IaaS) architecture so as to cause a series of operational blocks to be performed on the computer or other programmable apparatus to produce a computer implemented process such that the instructions, which execute on the computer or other programmable apparatus provide blocks for implementing the functions/acts specified in the flowchart and/or block diagram block or blocks. It is contemplated that any part of any aspect or embodiment discussed in this specification can be implemented or combined with any part of any other aspect or embodiment discussed in this specification.

Further advantages and features consistent with this disclosure will be set forth in the following detailed description, with reference to the drawings.

Attention is directed to FIG. 1, which depicts an example system 100 that includes a radio 102, an audio accessory 104, and a cable 106, and the like, therebetween. As depicted, the radio 102 comprises one or more of a two-way radio, a land mobile radio (LMR), a digital mobile radio (DMR), and the like. Furthermore, the audio accessory 104 comprises a remote speaker microphone (RSM), and the like. As depicted, the cable 106 may extend from the audio accessory 104 and end in a plug 108, that plugs into a hardware port of the radio 102, to connect the radio 102 and the audio accessory 104; however the radio 102 and the audio accessory 104 may be connected in any suitable manner.

In general, the radio 102 may generate audio signals, and the like, which are provided to the audio accessory 104. While not depicted in FIG. 1 (e.g., see FIG. 2), the audio accessory 104 is understood to include a speaker, which "plays" the audio signals to emit sound. For example, the radio 102 may be operated to communicate with a communication network to conduct communications (including, but not limited to, push-to-talk communications and/or talkgroup communications) with other radio devices, and the like, and the audio accessory 104 may comprise an RSM, at which sound is emitted (e.g., and received) in conducting such communications.

While as depicted the audio accessory 104 comprises an RSM, the audio accessory may comprise any suitable audio accessory that includes at least a speaker to output sound based on audio signals that originate from the radio 102.

Figure 2:
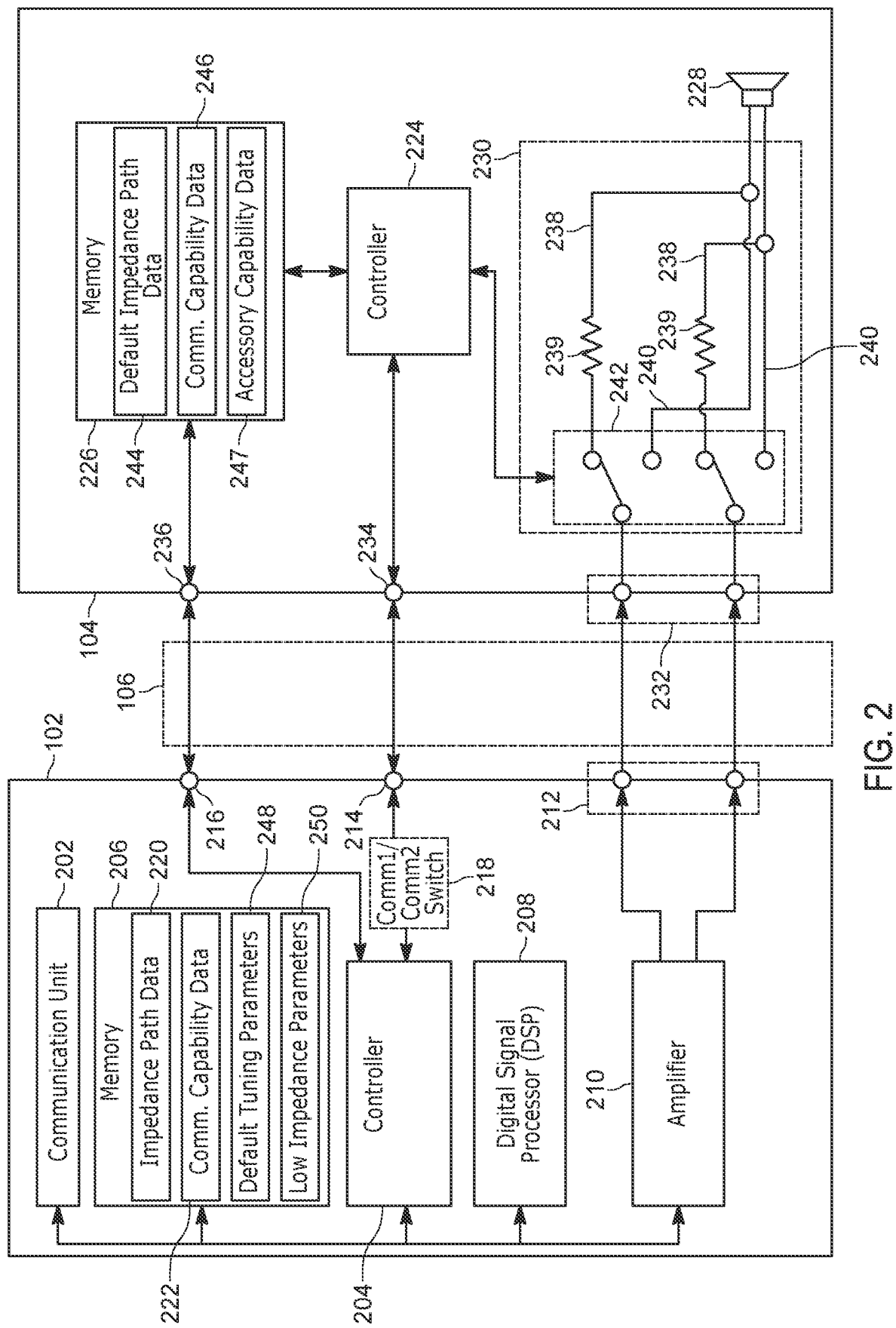
FIG. 2 is a device diagram showing device structures of the radio and the audio accessory, in accordance with some examples.

Attention is next directed to FIG. 2, which depicts schematic block diagrams of the radio 102 and the audio accessory 104, and further showing connections therebetween via the cable 106.

As depicted, the radio 102 comprises: a communication unit 202, a controller 204, a memory 206, a digital signal processor (DSP) 208, and an amplifier 210. The controller 204 is understood to be communicatively connected to other components of the radio 102 for example via a common data and address bus, and the like. As depicted, the DSP 208 is further connected communicatively connected the communication unit 202 such that the DSP 208 may receive signals from the communication unit 202, convert the signals to audio signals, and provide the audio signals to the amplifier 210, which amplifies the audio signals to output the audio signals to the audio accessory 104 via an audio interface 212.

For example, the radio 102 further comprises the audio interface 212, a first data interface 214 and a second data interface 216.

The communication unit 202 may include one or more wired and/or wireless input/output (I/O) interfaces that are configurable to communicate with other radios, and the like. For example, the communication unit 202 may include one or more wired and/or wireless transceivers for communicating with other radios, and the like. Such transceivers may also be coupled to a combined modulator/demodulator.

In particular, the communication unit 202 may be adapted for communication with one or more of the Internet, a digital mobile radio (DMR) network, a Project 25 (P25) network, a terrestrial trunked radio (TETRA) network, a Bluetooth network, a Wi-Fi network, for example operating in accordance with an IEEE 802.11 standard (e.g., 802.11a, 802.11b, 802.11g), an LTE (Long-Term Evolution) network and/or other types of GSM (Global System for Mobile communications) and/or 3GPP (3rd Generation Partnership Project) networks, a 5G network (e.g., a network architecture compliant with, for example, the 3GPP TS 23 specification series and/or a new radio (NR) air interface compliant with the 3GPP TS 38 specification series) standard), a Worldwide Interoperability for Microwave Access (WiMAX) network, for example operating in accordance with an IEEE 802.16 standard, and/or another similar type of wireless network. Hence, the communication unit 202 may include, but are not limited to, a cell phone transceiver, a DMR transceiver, P25 transceiver, a TETRA transceiver, a 3GPP transceiver, an LTE transceiver, a GSM transceiver, a 5G transceiver, a Bluetooth transceiver, a Wi-Fi transceiver, a WiMAX transceiver, and/or another similar type of wireless transceiver configurable to communicate via a wireless radio network.

The communication unit 202 may further include one or more wireline transceivers, such as an Ethernet transceiver, a USB (Universal Serial Bus) transceiver, or similar transceiver configurable to communicate via a twisted pair wire, a coaxial cable, a fiber-optic link, or a similar physical connection to a wireline network.

The DSP 208 is generally to generate sound signals, for example based on data and/or signals received via the communication unit 202. Similarly, the amplifier 210 is generally to output the sound signals to the audio interface 212.

As depicted, the first data interface 214 is connected to the controller 204 via an optional switch 218, which may be controlled by the controller 204 to cause the controller 204 and the first data interface 214 to be configured to operate according to a first communication protocol (e.g., "Comm1") or a second communication protocol (e.g., "Comm2"); as such, for clarity, the switch 218 is interchangeably referred to hereafter as the communication switch. For example, the first communication protocol may comprise a Universal Serial Bus (USB) protocol and the second communication protocol may comprise a Universal Asynchronous Receiver-Transmitter (UART) protocol. However, the communication switch 218 may be optional and the controller 204 and the first data interface 214 may be configured to operate according to a single communication protocol.

As depicted, the memory 206 further stores default impedance path data 220 and communication capability data 222. The data 220, 222 may be preconfigured at the memory 206, for example at a factory, and the like.

The default impedance path data 220 may define and/or specify whether the amplifier 210 is configured to output audio signals over a high impedance path or over a low impedance path at an audio accessory, as described in more detail below.

The communication capability data 222 may define and/or specify the communication protocols, with which the first data interface 214 may be used, such as both, or one of, the USB and UART communication protocols.

The first data interface 214 and the second data interface 216 are described in more detail below.

The audio accessory 104 comprises a controller 224, a memory 226, a speaker 228, a switching circuit 230, an audio interface 232, a first data interface 234 and a second data interface 236. The controller 224 is understood to be communicatively connected to other components of the audio accessory 104 for example via a common data and address bus, and the like.

The audio interface 232 is generally to connect to the respective audio interface 212 of the radio 102. Conversely, the audio interface 212 of the radio 102 is to connect to the respective audio interface 232 of the audio accessory 104. For example, as depicted, the audio interfaces 212, 232 generally comprise two respective terminals and/or connectors and/or pins, and the like, that connect to each other, and which correspond to two respective connections at the speaker 228.

The switching circuit 230 is generally located between the audio interface 232, of the audio accessory 104, and the speaker 228, the switching circuit comprising: a high impedance path 238 between the audio interface 232 and the speaker 228; a low impedance path 240 between the audio interface 232 and the speaker 228; and a switch 242 to connect the audio interface 232 to the speaker 228 via one of the high impedance path 238 or the low impedance path 240. As depicted, the switch 242 initially connects the audio interface 232 to the speaker 228 via the high impedance path 238.

In particular, the switch 242, as depicted, comprises a pair of double throw switches, and the like, and each of the impedance paths 238, 240 comprises a pair of speaker lines from the speaker 228 that may be connected, via the switch 242, to respective terminals of the audio interface 232. The switch 242 may be in any suitable format, however.

In particular, as depicted, the high impedance path 238 comprises a respective resistor 239 on each line, while the low impedance path 240 is absent of such resistors. In other examples, the high impedance path 238 may comprise a single resistor 239 on one speaker line; however, the high impedance path 238 may comprise any suitable arrangement of electrical components (e.g., resistors) on one or both speaker lines, that causes the high impedance path 238 to have a higher impedance relative to the low impedance path 240.

As depicted, the speaker 228 may be connected to other components of the audio accessory 104 via a pair of speaker lines, for example, respectively connected to a pair of terminals (e.g., high and low terminals) of the speaker 228. As such, the audio interface 232 may be connected to the switch 242 via a first pair of speaker lines, which connect to the terminals of the speaker 228 via the switch 242 and one of the high impedance path 238 and the low impedance path 240. Hence the high impedance path 238 may similarly comprise: a second pair of speaker lines between the switch 242 and the speaker 228; and respective resistors 239 on the second pair of speaker lines. Similarly, the low impedance path 240 may comprise a third pair of speaker lines comprising a direct path, absent of resistors, between the switch 242 and the speaker 228.

The first data interface 234 of the audio accessory 104 is generally to connect to the respective first data interface 214 of the radio 102, and vice versa. For example, the first data interface 214 of the radio 102 is generally to connect to the respective first data interface 234 of the audio accessory 104. In particular, the first data interfaces 214, 234 are generally to connect the controllers 204, 224 such that the controllers 204, 224 may communicate.

Similarly, the second data interface 236 of the audio accessory 104 is generally to connect to the respective second data interface 216 of the radio 102, and vice versa. For example, the second data interface 216 of the radio 102 is generally to connect to the respective second data interface 236 of the audio accessory 104. In particular, the second data interfaces 216, 236 are generally to connect the memory 226 of the audio accessory 104 to the controller 204 of the radio 102, such that the controller 204 of the radio 102 may retrieve and/or receive data from the memory 226.

The memory 226 of the audio accessory 104 may comprise a single memory device, or the memory 226 of the audio accessory 104 may comprise a plurality of memory devices of the audio accessory 104. In some examples, the memory 226 may not be connected to controller 224.

In particular, as depicted, the memory 226 stores default impedance data 244, optional communication capability data 246, and optional accessory capability data 247. The default impedance data 244 comprises data indicating that the audio interface 232 of the audio accessory 104 is initially connected to the speaker 228 via the high impedance path 238. The accessory capability data 247 comprises data indicating that the audio accessory 247 is capable of switching between a high impedance path and a low impedance path.

The optional communication capability data 246 comprises data indicating at communication protocols, with which the controller 224 is configured to communicate over the first data interface 234, for example one, or both, of the first data communication protocol (e.g., USB) and the second data communication protocol (e.g., UART). For backwards compatibility, and the like, the first data interface 234 and the controller 224 may be configured to communicate via two communication protocols; as such, in these examples, the communication capability data 246 may indicate at least two communication protocols, with which the controller 224 is configured to communicate over the first data interface 234.

In general, the second data interface 236 is to connect the memory 226 to the respective second data interface 216 of the radio 102, for example to provide the default impedance path data 244 to the radio 102 and in particular the controller 204 of the radio 102. The second data interface 236 may be further to provide the communication capability data 246 and/or the accessory capability data 247 to the radio 102 and in particular the controller 204 of the radio 102.

Hence, it is further understood that the second data interface 216 of the radio 102 is to connect to the respective second data interface 236 of the audio accessory 104, for example to retrieve and/or receive, via the second data interface 236, from the audio accessory 104, the default impedance path data 244, and, optionally, the communication capability data 246 and/or the accessory capability data 247.

Returning to the radio 102, as has been previously described, the DSP 208 and the amplifier 210 may be configured to output audio signals to the audio accessory 104 via the audio interface 212. Such output may occur according to different parameters, depending on whether the switching circuit 230 is switched to the high impedance path 238 or the low impedance path 240. Hence, as depicted, the memory 206 further stores default tuning parameters 248 and low impedance parameters 250, which may comprise parameters may be used to tune one or more of the DSP 208 and the amplifier 210 when respectively outputting sound signals over the high impedance path 238 and the low impedance path 240. For example, the parameters 248, 250 define one or more of respective currents, voltages and power, at which to control the one or more of the DSP 208 and the amplifier 210. In particular, The parameters 248, 250 stored at the memory 206 may include, but are not limited to, parameters for voltage gain, frequency response equalization, filter coefficients, voltage limits, current limits, thermal limits, and single or multiband compression and expansion coefficients. Such parameters 248, 250 may be used by the DSP 208 and/or the amplifier 210 and/or the controller 204 to tune performance for a selected impedance path for performance optimization (e.g., of output sound) and/or safety purposes.

While not depicted, the audio accessory 104 may further comprise one or more microphones, and the radio 102 and the audio accessory 104 may comprise respective audio interfaces for connecting the microphone to the radio 102 and/or the DSP 208 and/or the controller 204.

Similarly, the radio 102 may comprise a respective speaker and a respective one or more microphones for use in communicating when the audio accessory 104 is not connected to the radio 102.

It is further understood that the cable 106 may house connections, such as wires and the like, to connect the various interfaces of the radio 102 and the audio accessory 104 to each other. Furthermore, the interfaces 212, 214, 216 (and any audio interface for one or more microphones) may be combined into a hardware port of the radio 102, and the plug 108 of the cable 106, that inserts and/or connects into the hardware port, may combine connections to the interfaces 212, 214, 216 (and any audio interface for one or more microphones) therein.

While not depicted, the radio 102 and/or the audio accessory 104 may include one or more of a respective input device and/or a respective display screen, which, when present, may be communicatively coupled to a respective controller 204, 224. For example, an input device of the radio 102 may comprise push-to-talk button, and the like. Similarly, an input device of the audio accessory 104 may comprise push-to-talk button, and the like, and, in these examples, the radio 102 and the audio accessory 104 may further control push-to-talk communications, and the like, at the radio 102 via the push-to-talk button at the audio accessory 104, and such control may occur via the respective first data interfaces 214, 234.

While not depicted, the radio 102 may further power the audio accessory 104 via respective connections (not depicted), such as from a battery of the radio 102, and the like. When the radio 102 is turned on or off, the radio 102 may respectively supply or cut power to the audio accessory 104. Furthermore, when the radio 102 is turned off, the radio 102 may indicate to the audio accessory 104, for example via the respective first data interfaces 214, 234, that the radio 102 is being turned off, which may cause the audio accessory 104 to control the switch 242 to connect the audio interface 232 to the speaker 228 via the high impedance path 238 (e.g., when the switch 242 is connecting the audio interface 232 to the speaker 228 via the low impedance path 240).

While not depicted, the controllers 204, 224 may be components of respective processing units that may include respective code ROM coupled to a respective common data and address bus for storing data for initializing system components of the radio 102 and the audio accessory 104.

The controllers 204, 224 and the DSP 208 may respectively include one or more logic circuits, one or more processors, one or more microprocessors, one or more GPUs (Graphics Processing Units), and/or the controllers 204, 224 and the DSP 208 may respectively include one or more ASIC (application-specific integrated circuits) and one or more FPGA (field-programmable gate arrays), and/or another electronic device. In some examples, the controllers 204, 224 and/or the radio 102 and the audio accessory 104 are not a generic controllers and/or a generic devices, but devices specifically configured to implement functionality for controlling the audio accessory 104 to switch from a high impedance path to a low impedance path. For example, in some examples, the controllers 204, 224 and/or the radio 102 and the audio accessory 104 specifically comprises respective computer executable engines configured to implement functionality to control the audio accessory 104 to switch from a high impedance path to a low impedance path.

The memories 206, 226 may comprise any suitable combination of respective random access memories (RAM), a read only memories (ROM), and the like.

It is further understood that the memories 206, 226 may comprise respective a non-transitory machine readable medium that stores machine readable instructions to implement one or more programs or applications. Example machine readable media include a non-volatile storage unit (e.g., Erasable Electronic Programmable Read Only Memory ("EEPROM"), Flash Memory) and/or a volatile storage unit (e.g., random-access memory ("RAM")). In the example of FIG. 2, respective programming instructions (e.g., machine readable instructions) that implement the functionality of the radio 102 and the audio accessory as described may be maintained, persistently, at the memories 206, 226 and used by the controllers 204, 224, which makes appropriate utilization of respective volatile storage during the execution of such respective programming instructions.

Figure 3:
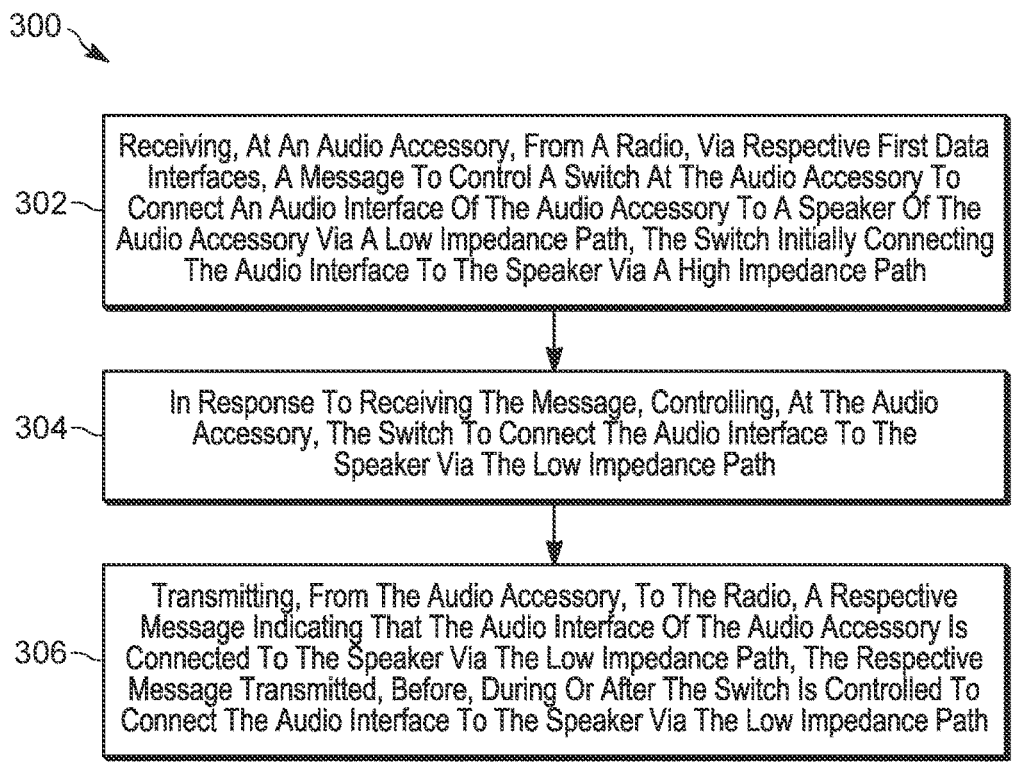
FIG. 3 is a flowchart of a method to switch, at an audio accessory, from a high impedance path to a low impedance path, in accordance with some examples.

Furthermore, while not depicted the memory 226 may store instructions, when executed by the controller 224, enables the controller 224 to implement functionality for switching from a high impedance path to a low impedance path, including but not limited to, the blocks of the method set forth in FIG. 3. However, when the memory 226 is not connected to the controller 224, the controller 224 may be specifically configured to implement functionality for switching from a high impedance path to a low impedance path.

Figure 4:
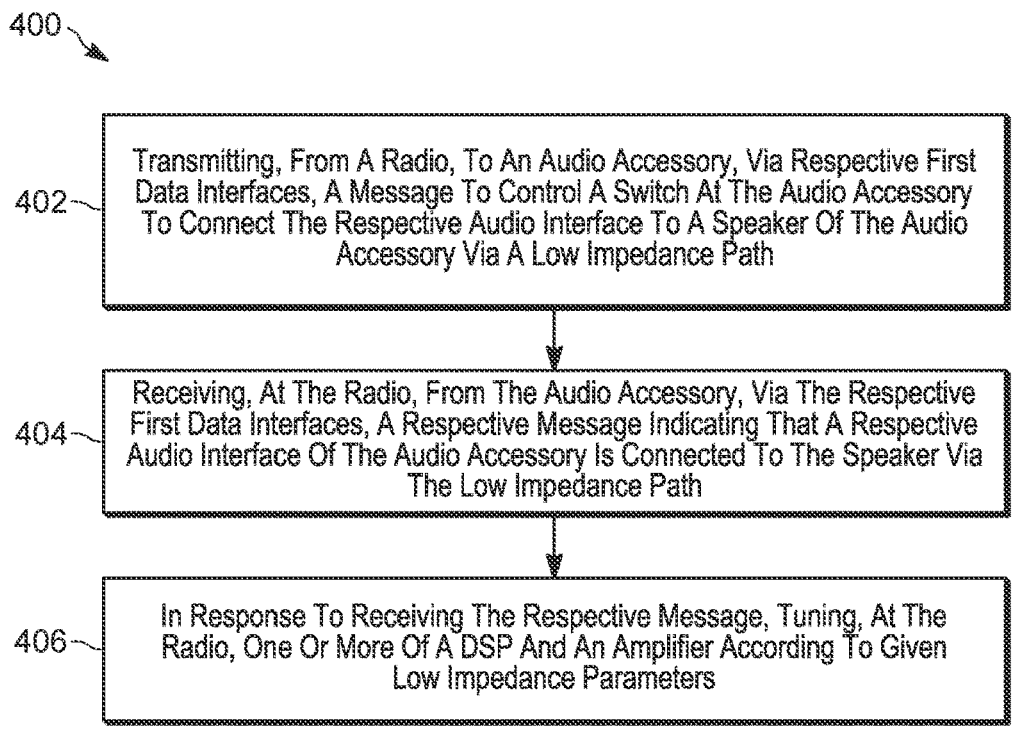
FIG. 4 is a flowchart of a method to control, at a radio, an audio accessory to switch from a high impedance path to an impedance path, in accordance with some examples.

Furthermore, while not depicted the memory 206 may store instructions, when executed by the controller 204, enables the controller 204 to implement functionality for controlling an audio accessory to switch from a high impedance path to a low impedance path, including but not limited to, the blocks of the method set forth in FIG. 4.

Attention is now directed to FIG. 3, which depicts a flowchart representative of a method 300 for switching from a high impedance path to a low impedance path at an audio accessory. The operations of the method 300 of FIG. 3 correspond to machine readable instructions that are executed by the audio accessory 104, and specifically the controller 224 of the audio accessory 104. In the illustrated example, the instructions represented by the blocks of FIG. 3 may be stored at the memory 226, for example as an application. The method 300 of FIG. 3 is one way that the audio accessory 104 and/or the controller 224 and/or the system 100 may be configured. Furthermore, the following discussion of the method 300 of FIG. 3 will lead to a further understanding of the system 100, and its various components.

The method 300 of FIG. 3 need not be performed in the exact sequence as shown and likewise various blocks may be performed in parallel rather than in sequence. Accordingly, the elements of method 300 are referred to herein as "blocks" rather than "steps." The method 300 of FIG. 3 may be implemented on variations of the system 100 of FIG. 1, as well.

Furthermore, as will explained below, the method 300 may be implemented at the audio accessory 104 in conjunction with the method 400 implemented at the radio 102.

At a block 302, the controller 224 and/or the audio accessory 104 receives, from the radio 102, via respective first data interfaces 214, 234, a message to control the switch 242 at the audio accessory 104 to connect the audio interface 232 of the audio accessory 104 to the speaker 228 of the audio accessory 104 via the low impedance path 240.

It is further understood that the switch 242 is initially connecting the audio interface 232 to the speaker 228 via the high impedance path 238. Similarly, in these examples, prior to the radio 102 transmitting the message, the radio 102 may output audio signals to the audio accessory 104 using the default tuning parameters 248.

Hence, initially, as the switch 242 is initially connecting the audio interface 232 to the speaker 228 via the high impedance path 238, if the audio accessory 104 is connected to a radio that is not capable of outputting audio signals via the low impedance path 240, and/or a radio that may be damaged when an amplifier thereof is connected to the low impedance path 240, the switch 242 is initially connecting the audio interface 232 to the speaker 228 via the high impedance path 238 to prevent such damage from occurring.

However, as the radio 102 is capable of outputting audio signals via the low impedance path 240, the message from the radio 102 generally indicates that the radio 102 is capable of outputting audio signals via the low impedance path 240. Transmission of the message by the radio 102 will be described in more detail below with respect to the method 400.

At a block 304, the controller 224 and/or the audio accessory 104, in response to receiving the message, controls the switch 242 to connect the audio interface 232 to the speaker 228 via the low impedance path 240. Hence, the switch 242 changes from connecting the audio interface 232 to the speaker 228 from the high impedance path 238 to the low impedance path 240. An example of such a change is described below with respect to FIG. 6.

However, the method 300 may further include the controller 224 and/or the audio accessory 104, absent of receiving the message of the block 302, refraining from controlling the switch 242 to connect the audio interface 232 to the speaker 228 via the low impedance path 240, such that the switch 242 continues to connect the audio interface 232 to the speaker 228 via the high impedance path 238. Put another way, when the message of the block 302 is not received, a radio to which the audio accessory 104 is connected may not be capable of outputting audio signals on the low impedance path 240, and hence such a radio does not send a message.

At a block 306, the method 300 may further include the controller 224 and/or the audio accessory 104 transmitting, to the radio 102, via respective first data interfaces 214, 234, a respective message indicating that the audio interface 232 of the audio accessory 104 is connected to the speaker 228 via the low impedance path 240. Such a respective message hence indicates to the radio 102 to tune one or more of the DSP 208 and the amplifier 210 according to the given low impedance parameters 250 and hence output audio signals accordingly that are configured for the low impedance path 240. As such, when the radio 102 receives the respective message, the radio 102 may accordingly tune one or more of the DSP 208 and the amplifier 210 according to the given low impedance parameters 250. Such a respective message may be transmitted, before, during or after the switch 242 is controlled to connect the audio interface 232 to the speaker 228 via the low impedance path 240. In some examples, timing of transmission of the respective message may be such that the radio 102 doesn't tune one or more of the DSP 208 and the amplifier 210 according to the given low impedance parameters 250 before the switch to the low impedance path 240 occurs. However, in other examples, timing of the respective message may be irrelevant as the radio 102 and/or the amplifier 210 may be generally capable of outputting audio signals, tuned for the high impedance path 238, on the low impedance path 240, without damaging the radio 102 and/or the amplifier 210.

To assist with backwards compatibility when connecting the audio accessory 104 to radios not capable of outputting audio signals over the low impedance path 240, the method 300 may further include the controller 224 and/or the audio accessory 104, prior to receiving the message at the block 302, providing, from the memory 226 of the audio accessory 104, to the radio 102 (or another radio), via the respective second data interfaces 216, 236, the default impedance path data 244 indicating that the audio interface 232 is initially connected to the speaker 228 via the high impedance path 238. As such, regardless of capability of a radio to which the audio accessory 104 is connected, a radio receiving the default impedance path data 244 will tune a respective DSP and/or amplifier according to default and/or high impedance path parameters, such as the default tuning parameters 248.

To assist with backwards compatibility when connecting the audio accessory 104 to radios not capable of communicating via communications protocols, with which the audio accessory 104 is capable of communicating, the method 300 may further include the controller 224 and/or the audio accessory 104, prior to receiving the message of the block 302, providing, from the memory 226 of the audio accessory 104, to the radio 102 (or another radio), via the respective second data interfaces 216, 236, the communication capability data 246 indicating the communication protocols (e.g., two communication protocols), with which the audio accessory 104 is configured to communicate over the respective first data interfaces 214, 234. A radio receiving the communication capability data 246 may determine whether, or not, the radio is capable of communicating via any of the communication protocols indicated by the communication capability data 246. If the radio may is capable of communicating via any of the communication protocols indicated by the communication capability data 246, the radio may transmit the message of the block 302 and/or the radio may first configure a respective controller and/or a respective data interface accordingly (e.g., optionally via a respective switch such as the communication switch 218) and then transmit the message of the block 302. However, if the radio is not capable of communicating via any of the communication protocols indicated by the communication capability data 246, the radio does not transmit the message of the block 302, and hence the audio accessory 104 does not switch to the low impedance path 240.

To further assist with backwards compatibility when connecting the audio accessory 104 to the radio 102, the method 300 may further include the controller 224 and/or the audio accessory 104, prior to receiving the message of the block 302, providing, from the memory 226 of the audio accessory 104, to the radio 102 (or another radio), via the respective second data interfaces 216, 236, the accessory capability data 247 indicating the audio accessory 104 is configured to switch between the high impedance path 238 and the low impedance path 240. A radio receiving the accessory capability data 247, such as the radio 102, may hence determine that the audio accessory 104 is capable of switching between the high impedance path 238 and the low impedance path 240. In particular, in these examples, when the accessory capability data 247 is not received at the radio 102, for example when the radio 102 is connected to another audio accessory not capable of switching between a high impedance path and a low impedance path, the radio 102 will not transmit the message (e.g., of the block 302) to such an audio accessory to control the such an audio accessory to connect a respective audio interface to a speaker via a low impedance path. Hence, the accessory capability data 247 provides a mechanism for preventing the radio 102 from implementing impedance path switching capability when connected to an audio accessory not capable of such impedance path switching.

The method 300 may further include the controller 224 and/or the audio accessory 104, upon one or more of disconnecting from the radio 102, and receiving an indication of being turned off (e.g., from the radio 102), controlling the switch 242 to connect the audio interface 232 to the speaker 228 via the high impedance path 238. Put another way, the switch 242 connecting the audio interface 232 to the speaker 228 via the high impedance path 238, as depicted in FIG. 2, may comprise a default position of the switch 242 to prevent the low impedance path 240 from being connected to a radio incapable of providing sufficient current to drive the speaker 228 over the low impedance path 240. Indeed, in some examples, the switch 242 may automatically change to connecting the audio interface 232 to the speaker 228 via the high impedance path 238 when power is cut to the audio accessory 104 and/or when the audio accessory 104 is turned off.

Attention is now directed to FIG. 4, which depicts a flowchart representative of a method 400 for controlling an audio accessory to switch from a high impedance path to a low impedance path. The operations of the method 400 of FIG. 4 correspond to machine readable instructions that are executed by the radio 102, and specifically the controller 204 of the radio 102. In the illustrated example, the instructions represented by the blocks of FIG. 4 may be stored at the memory 206, for example as an application. The method 400 of FIG. 4 is one way that the radio 102 and/or the controller 204 and/or the system 100 may be configured. Furthermore, the following discussion of the method 400 of FIG. 4 will lead to a further understanding of the system 100, and its various components.

The method 400 of FIG. 4 need not be performed in the exact sequence as shown and likewise various blocks may be performed in parallel rather than in sequence. Accordingly, the elements of method 400 are referred to herein as "blocks" rather than "steps." The method 400 of FIG. 4 may be implemented on variations of the system 100 of FIG. 1, as well.

Furthermore, as will explained below, the method 400 may be implemented at the radio 102 in conjunction with the method 300 implemented at the audio accessory 104.

At a block 402, the controller 204 and/or the radio 102 transmits, via the respective first data interfaces 214, 234, to the audio accessory 104, a message to control the switch 242 at the audio accessory 104 to connect the respective audio interface 232 to the speaker 228 of the audio accessory 104 via the low impedance path 240. The message transmitted at the block 402 by the radio 102 may generally comprise the message received, at the block 302 of the method 300, by the audio accessory 104.

At a block 404, the controller 204 and/or the radio 102 receives, via the respective first data interfaces 214, 234, from the audio accessory 104, a respective message indicating that the respective audio interface 232 of the audio accessory 104 is connected to the speaker 228 via the low impedance path 240. The respective message received at the block 404 by the radio 102 may generally comprise the respective message transmitted, at the block 306 of the method 300, by the audio accessory 104.

At a block 406, the controller 204 and/or the radio 102, in response to receiving the respective message of the block 404, tunes one or more of the DSP 208 and the amplifier 210 according to the given low impedance parameters 250. Hence, the DSP 208 and the amplifier 210 outputs audio signals to the audio accessory 104, via the respective audio interfaces 212, 232 according to the given low impedance parameters 250 to drive the speaker 228 via the low impedance path 240.

It is further understood that the method 400 further comprises, the controller 204 and/or the radio 102, prior to receiving the respective message at the block 404, tunes one or more of the DSP 208 and the amplifier 210 according to the default tuning parameters 248.

The method 400 may comprise other features. For example, the method 400 may further comprise the controller 204 and/or the radio 102, prior to transmitting the message at the block 402, retrieving and/or receiving, via the respective second data interfaces 216 236, from the audio accessory 104 (e.g., the memory 226 of the audio accessory 104), the default impedance path data 244 indicating that the respective audio interface 232 of the audio accessory 104 is initially connected to the speaker 228 via the high impedance path 238. For example, upon connecting to the audio accessory 104, and/or when the radio 102 is turned on, the controller 204 and/or the radio 102 may automatically retrieve and/or receive the default impedance path data 244 from the memory 226 via the respective second data interfaces 216, 236. The controller 204 may process the default impedance path data 244 and initially tune the DSP 208 and/or the amplifier 210 according to the default tuning parameters 248, and not change tuning of the DSP 208 and/or the amplifier 210 until the respective message is received at the block 404.

The method 400 may further comprise the controller 204 and/or the radio 102, prior to transmitting the message at the block 402, retrieving and/or receiving, via the respective second data interfaces 216 236, from the audio accessory 104 (e.g., the memory 226 of the audio accessory 104), the communication capability data 246 indicating the communication protocols (e.g., which may comprise at least two communication protocols), with which the audio accessory 104 is configured to communicate over the respective first data interfaces 214, 234. For example, upon connecting to the audio accessory 104, and/or when the radio 102 is turned on, the controller 204 and/or the radio 102 may automatically retrieve and/or receive the communication capability data 246 from the memory 226 via the respective second data interfaces 216, 236.

In these examples, the controller 204 and/or the radio 102 may compare the communication capability data 246 received from the audio accessory 104 with the communication capability data 222 stored at the memory 206 of the radio 102. In response to a respective communication protocol of the radio 102 matching one of the communication protocols of the audio accessory 104 (e.g., as determined by comparing the data 222, 246, the controller 204 and/or the radio 102 may transmit the message of the block 402.

In particular examples, when the communication capability data 246 received from the audio accessory 104 indicates two communication protocols, with which the audio accessory 104 is configured to communicate over the respective first data interfaces 214, 234, the controller 204 and/or the radio 102 may, in response to a respective communication protocol of the radio 102 matching one of the at least two communication protocols, transmit the message of the block 402.

Furthermore, when the controller 204 and/or the radio 102 determines that a respective communication protocol of the radio 102 matches a communications protocol of the audio accessory 104, but the communication switch 218 is not set to the matching communication protocol, the controller 204 and/or the radio 102 may control the communication switch 218 to change to the matching communication protocol prior to transmitting the message of the block 402 and/or receiving the respective message of the block 404. When more than one respective communication protocol of the radio 102 matches a communications protocol of the audio accessory 104, the controller 204 and/or the radio 102 may use a default communication protocol of the radio 102, such as a USB protocol, and control the communication switch 218 accordingly (e.g., though the communication switch 218 may already be set to the default communication protocol, which may obviate such control).

In these examples, in response to the respective communication protocol of the radio 102 not matching a communication protocol of the audio accessory 104 (e.g., not matching one of the at least two communication protocols of the audio accessory 104), the controller 204 and/or the radio 102 refrains from transmitting the message of the block 402 such that communication with the audio accessory 104 fails. In these examples, the radio 102 may enter a fail safe mode, and may for example, provide an indication of the failure at a display screen and/or speaker of the radio 102 in such a fail safe mode, and/or provide audio signals (e.g., as received via the communication unit 202) via the speaker of the radio 102, and the like. Hence, in such a fail safe mode, audio signals may be redirected from the audio interface 212 of the radio 102 to a speaker of the radio 102 using, for example, a suitable switch, not depicted, but which may be similar to (or different from) the switch 242.

The method 400 may further comprise the controller 204 and/or the radio 102, prior to transmitting the message at the block 402, retrieving and/or receiving, via the respective second data interfaces 216 236, from the audio accessory 104 (e.g., the memory 226 of the audio accessory 104), the accessory capability data 247 indicating that the audio accessory 104 is configured to switch between the high impedance path 238 and the low impedance path 240; in response to receiving, from the audio accessory 104, via the respective second data interfaces 216 236, the accessory capability data 247, transmit the message of the block 402; and in response to failing to receive, from the audio accessory 104, via the respective second data interfaces 216 236, the accessory capability data 247, refraining from transmitting the message of the block 402.

For example, upon connecting to the audio accessory 104, and/or when the radio 102 is turned on, the controller 204 and/or the radio 102 may automatically retrieve and/or receive the accessory capability data 247 from the memory 226 via the respective second data interfaces 216, 236, and implement the method 400 in response. However, when the controller 204 and/or the radio 102 does not receive the accessory capability data 247, the radio 102 may be connected to an audio accessory that is not capable of switching between a high impedance path and a low impedance path, and hence the radio 102 refrains from transmitting the message of the block 402 and/or refrains from implementing the method 400.

The method 400 may further include the controller 204 and/or the radio 102, upon one or more of disconnecting from the audio accessory 104, and being turned off, tuning one or more of the DSP 208 and the amplifier 210 according to the default tuning parameters 248. Put another way, the default tuning parameters 248 may be used to place the one or more of the DSP 208 and the amplifier 210 into respective default states where the DSP 208 and/or the amplifier 210 are configured to output signals according to the high impedance path 238. Indeed, in some examples, the controller 204 and/or the radio 102 may place the DSP 208 and/or the amplifier 210 into such a default state, other than between when the respective message of the block 404 is received and when the audio accessory 104 is disconnected (e.g., unplugged), and the radio 102 is off.

Figure 5:
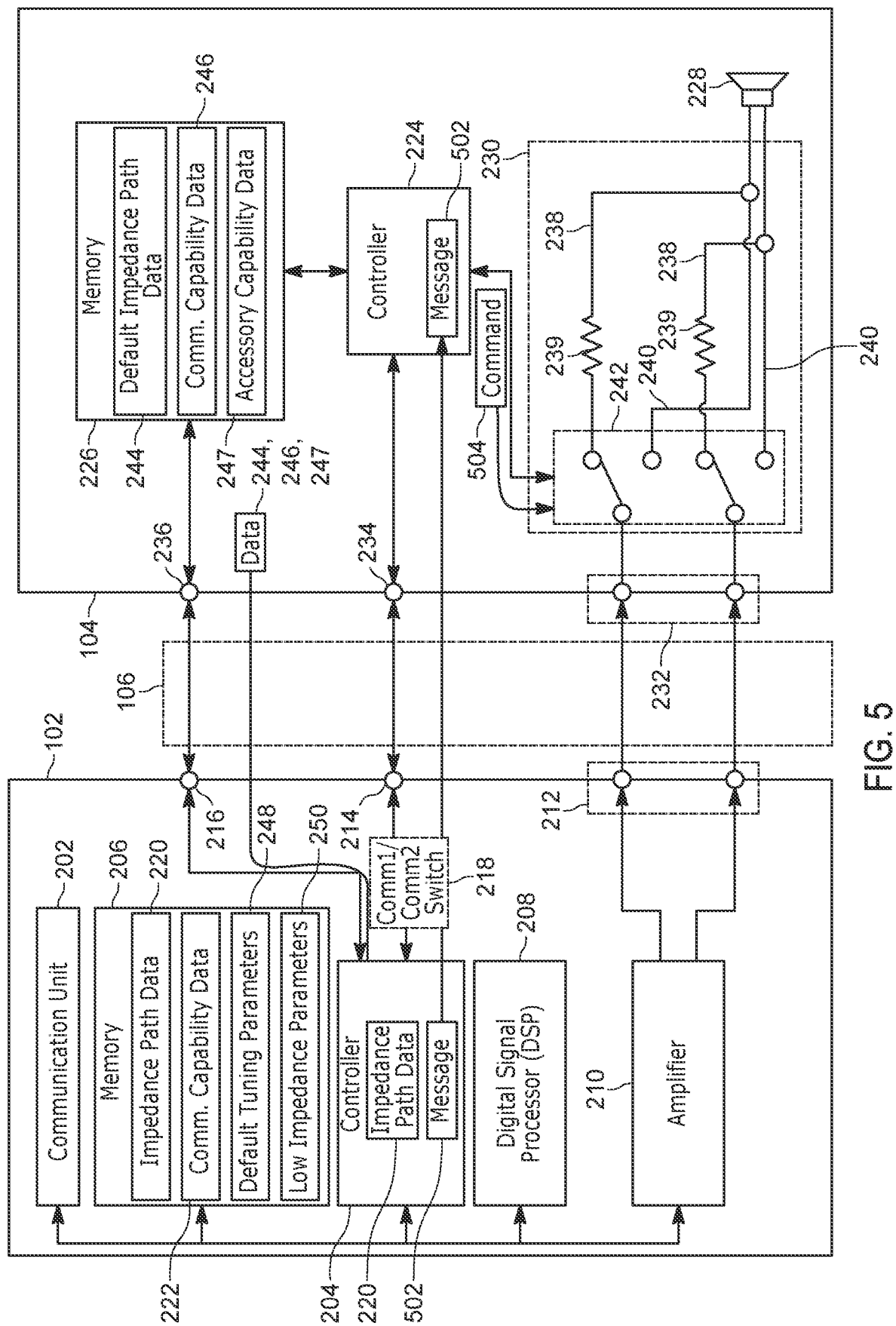
FIG. 5 depicts the radio and the audio accessory of FIG. 2 implementing methods to switch from the high impedance path to the low impedance path at the audio accessory, in accordance with some examples.
Figure 6:
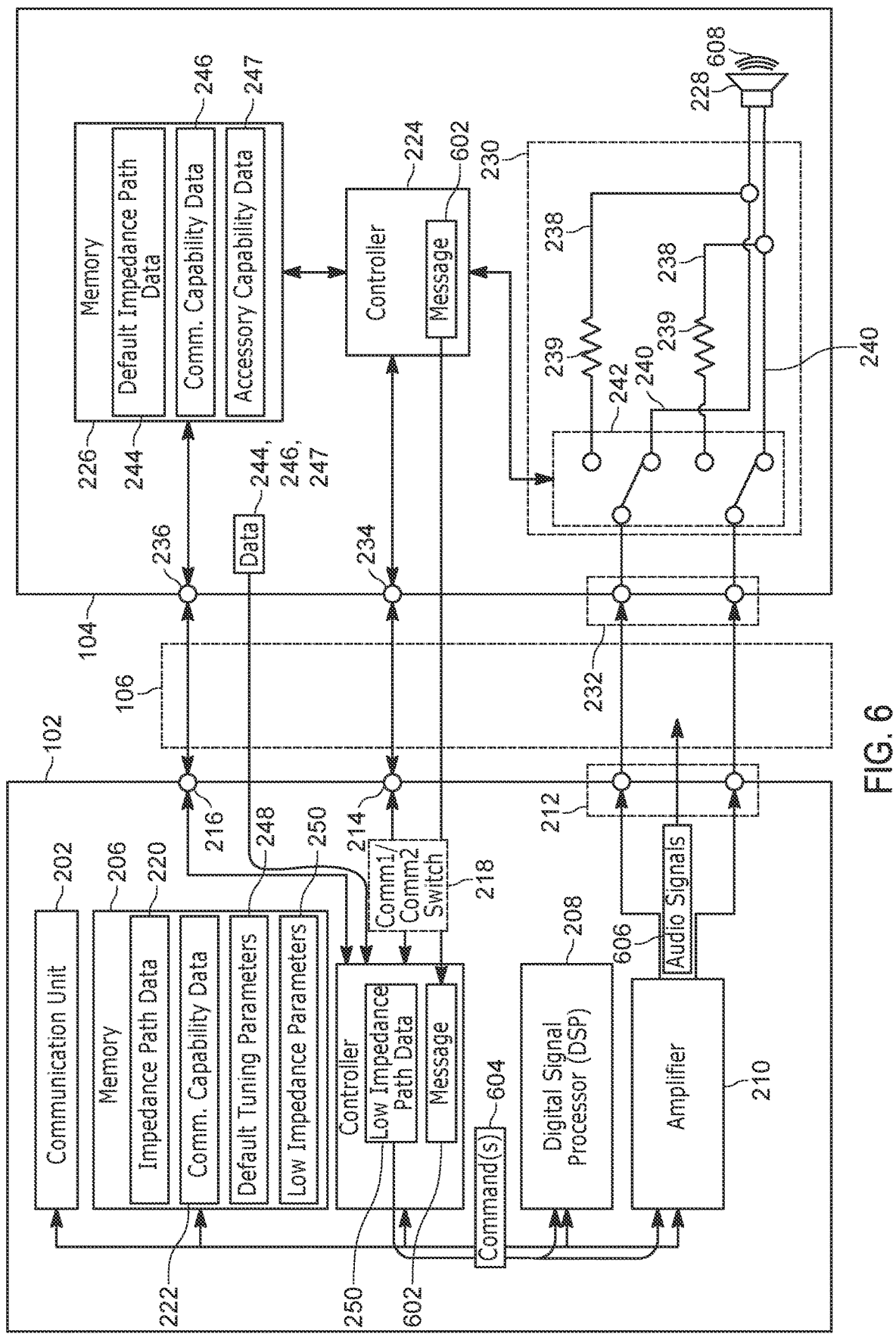
FIG. 6 depicts the radio and the audio accessory of FIG. 2 further implementing methods to switch from the high impedance path to the low impedance path at the audio accessory, in accordance with some examples.

Attention is next directed to FIG. 5 and FIG. 6, which depict aspects of examples of the method 300 and the method 400. FIG. 5 and FIG. 6 are substantially similar to FIG. 2, with like components having like numbers.

Attention is first directed to FIG. 5, which, similar to FIG. 2, depicts the switch 242 initially connecting the audio interface 232 of the audio accessory 104 to speaker 228 via the high impedance path 238. Hence, in FIG. 5, it understood that the audio accessory 104 may have been connected to the radio 102 (e.g., via the plug 108 and the cable 106), and/or that the radio 102 and the audio accessory 104 were turned on, just prior to the example of FIG. 5. It is further understood that the DSP 208 and/or the amplifier 210 are initially tuned according to the default tuning parameters 248.

As depicted in FIG. 5, the radio 102 retrieves and/or receives the data 244, 246, 247 from the memory 226 of the audio accessory 104 via the respective second data interfaces 216, 236. The radio 102 may optionally compare the communication capability data 246 received from the audio accessory 104 with the communication capability data 222 stored at the memory 206 of the radio 102, and control the communication switch 218 accordingly. The radio 102 may optionally process the accessory capability data 246 received from the audio accessory 104 and determine to proceed with controlling the audio accessory 104 to switch from the high impedance path 238 to the low impedance path 240, as described hereafter.

Also depicted in FIG. 5, the controller 204 processes the impedance path data 220 and transmits (e.g., at the block 402 of the method 400) a message 502 to the audio accessory 104 to control the switch 242 at the audio accessory 104 to connect the respective audio interface 232 to the speaker 228 via the low impedance path 240. The audio accessory 104 receives (e.g., at the block 302 of the method 300) the message 502 and, in response (e.g., at the block 304 of the method 300) controls the switch 242 to connect the audio interface 232 to the speaker 228 via the low impedance path 240. For example, as depicted, the controller 224 may transmit a control command 504 (and/or a signal, and the like) to the switch 242 to connect the audio interface 232 to the speaker 228 via the low impedance path 240.

For example, attention is next directed to FIG. 6, which depicts the switch 242 connecting the audio interface 232 to the speaker 228 via the low impedance path 240. Furthermore, the audio accessory 104 transmits (e.g., at the block 306 of the method 300) a respective message 602 to the radio 102, via the respective first data interfaces 214, 234, the respective message 602 indicating that the respective audio interface 232 of the audio accessory 104 is connected to the speaker 228 via the low impedance path 240.

Hence, the radio 102 receives (e.g., at the block 404 of the method 400) the respective message 602 and, in response, tunes (e.g., at the block 406 of the method 400) one or more of the DSP 208 and the amplifier 210 according to the given low impedance parameters 250. For example, such tuning is depicted in FIG. 6 via tuning commands 604 the DSP 208 and/or the amplifier 210 (e.g., a command 604 to the DSP 208 and/or a command to the amplifier 210).

Thereafter, the radio 102 provides audio signals 606 to the audio accessory 104 via the low impedance path 240 and the speaker 228 outputs sound 608 based on the audio signals 606.

As should be apparent from this detailed description above, the operations and functions of electronic computing devices described herein are sufficiently complex as to require their implementation on a computer system, and cannot be performed, as a practical matter, in the human mind. Electronic computing devices such as set forth herein are understood as requiring and providing speed and accuracy and complexity management that are not obtainable by human mental steps, in addition to the inherently digital nature of such operations (e.g., a human mind cannot interface directly with RAM or other digital storage, switch an audio accessory between different impedance paths, cannot tune a DSP and/or an amplifier, and the like).

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "one of", without a more limiting modifier such as "only one of", and when applied herein to two or more subsequently defined options such as "one of A and B" should be construed to mean an existence of any one of the options in the list alone (e.g., A alone or B alone) or any combination of two or more of the options in the list (e.g., A and B together). Similarly the terms "at least one of" and "one or more of", without a more limiting modifier such as "only one of", and when applied herein to two or more subsequently defined options such as "at least one of A or B", or "one or more of A or B" should be construed to mean an existence of any one of the options in the list alone (e.g., A alone or B alone) or any combination of two or more of the options in the list (e.g., A and B together).

A device or structure that is "configured" in a certain way is configured in at least that way, but may also be configured in ways that are not listed.

The terms "coupled", "coupling" or "connected" as used herein can have several different meanings depending on the context, in which these terms are used. For example, the terms coupled, coupling, or connected can have a mechanical or electrical connotation. For example, as used herein, the terms coupled, coupling, or connected can indicate that two elements or devices are directly connected to one another or connected to one another through intermediate elements or devices via an electrical element, electrical signal or a mechanical element depending on the particular context.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Any suitable computer-usable or computer readable medium may be utilized. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. In the context of this document, a computer-usable or computer-readable medium may be any medium that can contain, store, communicate, propagate, or transport the program for use by or in connection with the instruction execution system, apparatus, or device.

Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation. For example, computer program code for carrying out operations of various example embodiments may be written in an object oriented programming language such as Java, Smalltalk, C++, Python, or the like. However, the computer program code for carrying out operations of various example embodiments may also be written in conventional procedural programming languages, such as the "C" programming language or similar programming languages. The program code may execute entirely on a computer, partly on the computer, as a stand-alone software package, partly on the computer and partly on a remote computer or server or entirely on the remote computer or server. In the latter scenario, the remote computer or server may be connected to the computer through a local area network (LAN) or a wide area network (WAN), or the connection may be made to an external computer (for example, through the Internet using an Internet Service Provider).

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. An audio accessory for a radio, the audio accessory comprising:
a speaker;
an audio interface to connect to a respective audio interface of the radio;
a switching circuit located between the audio interface and the speaker, the switching circuit comprising:
a high impedance path between the audio interface and the speaker;
a low impedance path between the audio interface and the speaker; and
a switch to connect the audio interface to the speaker via one of the high impedance path or the low impedance path, the switch initially connecting the audio interface to the speaker via the high impedance path;
a first data interface to connect to a respective first data interface of the radio; and
a controller configured to:
receive, via the first data interface, from the radio, a message to control the switch to connect the audio interface to the speaker via the low impedance path; and
in response to receiving the message, control the switch to connect the audio interface to the speaker via the low impedance path.

2. The audio accessory of claim 1, wherein the controller is further configured to:
absent of receiving the message, refrain from controlling the switch to connect the audio interface to the speaker via the low impedance path, such that the switch continues to connect the audio interface to the speaker via the high impedance path.

3. The audio accessory of claim 1, wherein the controller is further configured to:
transmit, via the first data interface, to the radio, a respective message that the audio interface is connected to the speaker via the low impedance path, the respective message being transmitted, before, during or after the switch is controlled to connect the audio interface to the speaker via the low impedance path.

4. The audio accessory of claim 1, wherein the controller is further configured to:
upon one or more of disconnecting from the radio, and receiving an indication of being turned off, control the switch to connect the audio interface to the speaker via the high impedance path.

5. The audio accessory of claim 1, further comprising:
a memory storing default impedance path data indicating that the audio interface is initially connected to the speaker via the high impedance path; and
a second data interface to connect the memory to a respective second data interface of the radio, the second data interface for providing the default impedance path data to the radio.

6. The audio accessory of claim 1, further comprising:
a memory storing communication capability data indicating at least two communication protocols, with which the controller is configured to communicate over the first data interface; and
a second data interface to connect the memory to a respective second data interface of the radio, the second data interface for providing the communication capability data to the radio.

7. The audio accessory of claim 1, wherein:
the audio interface is connected to the switch via a first pair of speaker lines,
the high impedance path comprises: a second pair of speaker lines between the switch and the speaker; and respective resistors on the second pair of speaker lines; and
the low impedance path comprises a third pair of speaker lines comprising a direct path, absent of resistors, between the switch and the speaker.

8. A method comprising:
receiving, at an audio accessory, from a radio, via respective first data interfaces, a message to control a switch at the audio accessory to connect an audio interface of the audio accessory to a speaker of the audio accessory via a low impedance path, the switch initially connecting the audio interface to the speaker via a high impedance path; and
in response to receiving the message, controlling, at the audio accessory, the switch to connect the audio interface to the speaker via the low impedance path.

9. The method of claim 8, further comprising:
transmitting, from the audio accessory, to the radio, a respective message indicating that the audio interface of the audio accessory is connected to the speaker via the low impedance path, the respective message transmitted, before, during or after the switch is controlled to connect the audio interface to the speaker via the low impedance path.

10. The method of claim 8, further comprising:
absent of receiving the message, refrain from controlling the switch to connect the audio interface to the speaker via the low impedance path, such that the switch continues to connect the audio interface to the speaker via the high impedance path.

11. The method of claim 8, further comprising:
prior to receiving the message, providing, from a memory of the audio accessory, to the radio, via respective second data interfaces, default impedance path data indicating that the audio interface is initially connected to the speaker via the high impedance path.

12. The method of claim 8, further comprising:
upon one or more of disconnecting from the radio, and receiving an indication of being turned off, controlling, at the audio accessory, the switch to connect the audio interface to the speaker via the high impedance path.

13. The method claim 8, further comprising:
prior to receiving the message, providing, from a memory of the audio accessory, to the radio, via respective second data interfaces, communication capability data indicating at least two communication protocols, with which the audio accessory is configured to communicate over the respective first data interfaces.

14. The method claim 8, further comprising:
prior to receiving the message, providing, from a memory of the audio accessory, to the radio, via respective second data interfaces, accessory capability data indicating that the audio accessory is configured to switch between the high impedance path and the low impedance path.

15. A radio to connect to an audio accessory, the radio comprising:
an audio interface to connect to a respective audio interface of the audio accessory;
a digital signal processor (DSP) to generate sound signals;
an amplifier to output the sound signals to the audio interface;

a first data interface to connect to a respective first data interface of the audio accessory; and
a controller configured to:
  transmit, via the first data interface, to the audio accessory, a message to control a switch at the audio accessory to connect the respective audio interface to a speaker of the audio accessory via a low impedance path;
  receive, via the first data interface, from the audio accessory, a respective message indicating that the respective audio interface of the audio accessory is connected to the speaker via the low impedance path; and
  in response to receiving the respective message, tune one or more of the DSP and the amplifier according to given low impedance parameters.

16. The radio of claim 15, wherein the controller is further configured to:
  prior to receiving the respective message, tune the amplifier according to default tuning parameters.

17. The radio of claim 15, wherein the controller is further configured to:
  upon one or more of disconnecting from the audio accessory, and being turned off, tune one or more of the DSP and the amplifier according to default tuning parameters.

18. The radio of claim 15, further comprising a second data interface to connect to a respective second data interface of the audio accessory, and
  wherein the controller is further configured to:
    prior to transmitting the message, retrieve, via the second data interface, from the audio accessory, default impedance path data indicating that the respective audio interface of the audio accessory is initially connected to the speaker via a high impedance path.

19. The radio of claim 15, further comprising a second data interface to connect to a respective second data interface of the audio accessory, and
  wherein the controller is further configured to:
    prior to transmitting the message, receive from the audio accessory, via the second data interface, communication capability data indicating at least two communication protocols, with which the audio accessory is configured to communicate over a respective first data interface;
    in response to a respective communication protocol of the radio matching one of the at least two communication protocols, transmit the message; and,
    in response to the respective communication protocol of the radio not matching one of the at least two communication protocols, refrain from transmitting the message such that communication with the audio accessory fails.

20. The radio of claim 15, further comprising a second data interface to connect to a respective second data interface of the audio accessory, and
  wherein the controller is further configured to, prior to transmitting the message:
    in response to receiving, from the audio accessory, via the second data interface, accessory capability data indicating that the audio accessory is configured to switch between a high impedance path and the low impedance path, transmit the message; and,
    in response to failing to receive, from the audio accessory, via the second data interface, the accessory capability data indicating that the audio accessory is configured to switch between the high impedance path and the low impedance path, refrain from transmitting the message.

* * * * *